United States Patent
Taniguchi et al.

(10) Patent No.: US 7,626,388 B2
(45) Date of Patent: Dec. 1, 2009

(54) MAGNETIC RESONANCE IMAGER

(75) Inventors: Yo Taniguchi, Kokubunji (JP); Shinji Kurokawa, Hachioji (JP); Hisaaki Ochi, Kodaira (JP)

(73) Assignee: Hitachi Medical Corporation, Tokyo (JP)

( * ) Notice: Subject to any disclaimer, the term of this patent is extended or adjusted under 35 U.S.C. 154(b) by 464 days.

(21) Appl. No.: 10/586,732

(22) PCT Filed: Dec. 24, 2004

(86) PCT No.: PCT/JP2004/019365

§ 371 (c)(1),
(2), (4) Date: Jul. 21, 2006

(87) PCT Pub. No.: WO2005/084540

PCT Pub. Date: Sep. 15, 2005

(65) Prior Publication Data

US 2008/0231272 A1 Sep. 25, 2008

(30) Foreign Application Priority Data

Mar. 4, 2004 (JP) ............................. 2004-060143
Mar. 5, 2004 (JP) ............................. 2004-061856

(51) Int. Cl.
*G01V 3/00* (2006.01)

(52) U.S. Cl. ........................................ 324/309; 324/307
(58) Field of Classification Search ................. 324/309, 324/307
See application file for complete search history.

(56) References Cited

U.S. PATENT DOCUMENTS

| 5,329,925 | A  | * | 7/1994  | NessAiver     | 600/413 |
| 5,485,086 | A  | * | 1/1996  | Meyer et al.  | 324/307 |
| 6,515,477 | B1 | * | 2/2003  | Tasaka et al. | 324/309 |
| 7,323,873 | B2 | * | 1/2008  | Yamazaki      | 324/309 |
| 7,439,737 | B2 | * | 10/2008 | Weiss et al.  | 324/307 |

OTHER PUBLICATIONS

E. Mark Haacke, et al.: "Magnetic ResonanceImaging-Physical Principles and Sequence Design", Wiley-Liss, pp. 303-330, 1999.
Jackson JI, Meyer CH, Nishimura DG: Selection of a Convolution Function for Fourier Inversion Using Gridding, IEEE Trans. Med. Imaging, vol. 10, No. 3, pp. 473-478, 1991.

* cited by examiner

*Primary Examiner*—Louis M Arana
(74) *Attorney, Agent, or Firm*—Antonelli, Terry, Stout & Kraus, LLP.

(57) ABSTRACT

Provided is a magnetic resonance imager capable of efficiently suppressing artifacts in radial scanning that is short of the number of echoes. Part of unmeasured echoes is measured as a reference echo. An estimation coefficient is calculated using echoes adjoining the reference echo, and used to estimate the unmeasured echoes.

8 Claims, 9 Drawing Sheets

FIG.6
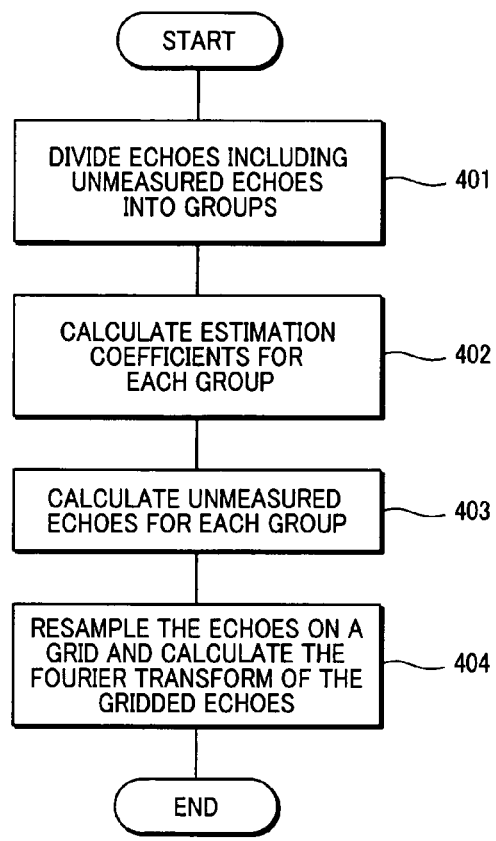
- START
- DIVIDE ECHOES INCLUDING UNMEASURED ECHOES INTO GROUPS — 401
- CALCULATE ESTIMATION COEFFICIENTS FOR EACH GROUP — 402
- CALCULATE UNMEASURED ECHOES FOR EACH GROUP — 403
- RESAMPLE THE ECHOES ON A GRID AND CALCULATE THE FOURIER TRANSFORM OF THE GRIDDED ECHOES — 404
- END
FIG.7A  FIG.7B  FIG.7C
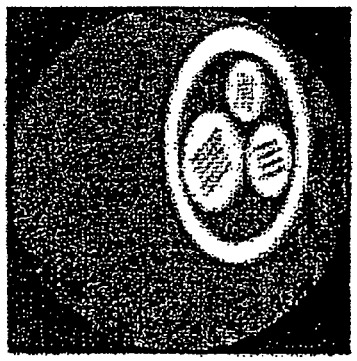 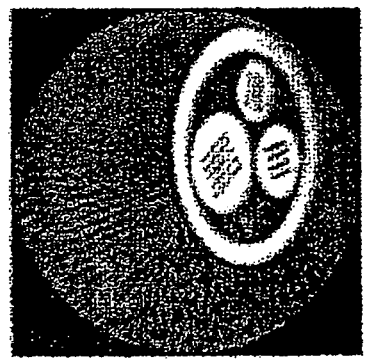 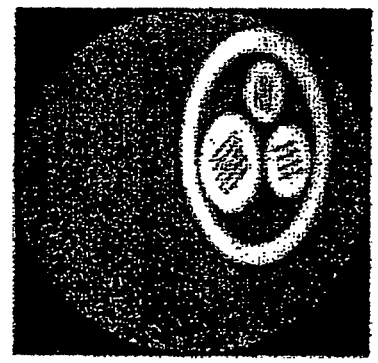

MAGNETIC RESONANCE IMAGER

TECHNICAL FIELD

The present invention relates to a magnetic resonance imaging technology.

BACKGROUND ART

Magnetic resonance imaging (MRI) apparatuses are medical-purpose image diagnosis systems that cause hydrogen atomic nuclei, which are contained in any transverse plane of a subject, to exhibit nuclear magnetic resonance, and produce a tomographic image of the plane using an induced nuclear magnetic resonance signal.

In general, when a slicing magnetic field gradient to be used to select a subject's plane whose tomographic image is to be produced is applied, an excitation pulse that excites magnetization in the plane is applied at the same time. Thus, a nuclear magnetic resonance signal (echo) is induced in the stage of convergence of the excited magnetization. In efforts to append positional information to magnetization, a phase-encoding magnetic field gradient and a readout magnetic field gradient that are perpendicular to each other in a section are applied until an echo results from excitation is acquired. A measured echo is mapped to a k-space having an axis of abscissas kx and an axis of ordinates ky. Image reconstruction is then performed through inverse Fourier transform.

A pulse with which an echo is induced and each magnetic field gradient are applied based on a predefined pulse sequence. As for the pulse sequence, various pulse sequences intended for respective purposes are known. For example, a gradient echo (GE)-type fast imaging method is a method in which a pulse sequence is repeatedly applied, a phase-encoding magnetic field gradient is sequentially changed for every repetition in order to measure the number of echoes required for producing one tomographic image.

FIG. 1(A) shows a pulse sequence to be employed in GE radial scanning (refer to, for example, "Magnetic Resonance Imaging—Physical Principles and Sequence Design" by E. Mark Haacke, et al. (Wiley-Liss, pp. 303-330, 1999)). Actions to be performed for the pulse sequence will be described below.

Along with application of a z-direction slicing magnetic field gradient 201, a radiofrequency (RF) magnetic field pulse 202 for excitation of magnetization of protons at a resonant frequency f0 is applied in order to induce a nuclear magnetic resonance phenomenon in protons in a certain slice of an object entity. After dephasing magnetic field gradient pulses 203, 204, and 205 are applied, while readout magnetic field gradient pulses 206 and 207 are applied, a nuclear magnetic resonance signal (echo) 208 is measured. After the measurement of an echo is completed, re-phasing magnetic field gradient pulses 209, 210, and 211 are applied in order to restore the phase of magnetization in preparation for the next excitation.

The above procedure is repeated Ne times with a repetition time TR determined, whereby Ne echoes are measured. The dephasing magnetic field gradient pulses 204 and 205, readout magnetic field gradient pulses 206 and 207, re-phasing magnetic field gradient pulses 209 and 210 have the amplitudes thereof changed for every repetition as shown in FIG. 1A. In the case of the illustrated sequence, the dephasing magnetic field gradient pulse 204 and re-phasing magnetic field gradient pulse 209 change step by step from −Ne/2 to Ne/2−1. The dephasing magnetic field gradient pulse 205 and re-phasing magnetic field gradient pulse 210 change step by step from 0 through −Ne/2 to −1. The readout magnetic field gradient pulse 206 changes step by step from Ne/2 to −Ne/2−1. The readout magnetic field gradient pulse 207 changes step by step from 0 through Ne/2 to 1.

Measured echoes are, as shown in FIG. 1(B), mapped to a k-space. The drawing is concerned with a case where Ne denotes 128. In the k-space, one echo is expressed with one line passing through an origin O, and echoes are disposed equidistantly in a rotating direction. A difference Δθ between the angles of adjoining echoes is π/Ne radian.

The k-space is transformed into a Cartesian grid by performing gridding (refer to, for example, "Selection of a Convolution Function for Fourier Inversion Using Gridding" by Jackson J I, Meyer G H, Nishimura D G (IEEE Trans. Med. Imaging, Vol. 10, No. 3, pp. 473-478, 1991)). Thereafter, image reconstruction is performed through two-dimensional inverse Fourier transform. An imaging time required for one image corresponds to a product of a TR by the number of echoes. For example, assuming that one image is reconstructed using one hundred and twenty-eight echoes with the TR set to 4 ms, the imaging time comes to 512 ms.

In order to reconstruct an image having N pixels in rows and columns, the number of samples per echo and the number of echoes are normally set to N. If the number of echoes is smaller than N, the imaging time is shortened and a temporal resolution improves. For example, assuming that only odd-numbered echoes shown in FIG. 1(B) are measured, the number of echoes is 64 and the imaging time is a half of the above imaging time.

DISCLOSURE OF THE INVENTION

Problem to be Solved by the Invention

However, when the temporal resolution is improved according to the foregoing method, a spatial resolution is degraded and artifacts occur. In this case, the k-space is expressed as shown in FIG. 2. In the drawing, a dot line 215 signifies that an echo has not been measured. Compared with the k-space shown in FIG. 1(B), the k-space is short of samples. Therefore, the spatial resolution of a reconstructed image is degraded and artifacts occur. Namely, when the number of echoes is decreased in order to improve the temporal resolution, artifacts occur to deteriorate image quality.

Moreover, the procedure starting with application of a slicing magnetic field gradient pulse and ending with measurement of an echo like the one shown in FIG. 1(A) is repeated with a repetition time TR determined appropriately. Echoes required for one image are thus measured. The echoes are mapped to the k-space as shown in FIG. 1(B), and then, as shown in FIG. 8(B), re-mapped to a grid-like k-space 802 by performing gridding. Thereafter, two-dimensional inverse Fourier transform is performed for image reconstruction. An imaging time required for one image is 0.256 sec on the assumption that the TR is set to 4 ms and sixty-four echoes are acquired. For imaging of the heart, since a cardiac cycle is approximately 1 sec, the cardiac motion is a non-ignorable factor affecting the image quality. If imaging is not performed in real time, the adverse effect of the cardiac motion can be suppressed according to a method such as cardiac gating. As for real-time imaging, a subject makes a large motion during imaging, and artifacts occur.

An object of the present invention is to provide a magnetic resonance imaging technology for efficiently suppressing artifacts in radial scanning.

Means for Solving the Problem

In order to accomplish the aforesaid object, a magnetic resonance imager in accordance with the present invention has features described below.

1. The magnetic resonance imager includes a control unit that controls a pulse sequence according to which a radiofrequency magnetic field and magnetic field gradients are applied to a subject lying down in a static magnetic field in order to detect a magnetic resonance signal induced in the subject, and a processing unit that handles the signal. The control unit (1) controls a pulse sequence based on which radial scanning is achieved, (2) applies the pulse sequence a plurality of times so as to acquire image echoes, and (3) applies the pulse sequence a plurality of times so as to acquire reference echoes each of which lies among image echoes in the k-space. The processing unit (1) divides the image echoes and reference echoes into a plurality of groups, (2) uses a reference echo and preceding and succeeding image echoes to calculate an estimation coefficient, (3) uses the estimation coefficient to estimate unmeasured echoes lying among the image echoes in the k-space.

2. The magnetic resonance imager includes a control unit that controls a pulse sequence according to which a radiofrequency magnetic field and magnetic field gradients are applied to a subject lying down in a static magnetic field in order to detect a nuclear magnetic resonance signal induced in the subject. The control unit (1) detects the nuclear magnetic resonance signal by radially scanning a k-space, (2) produces a plurality of images, (3) adopts a sliding window, and (4) performs the scanning at intervals of n echoes. Thus, artifacts are suppressed by a temporal filter.

According to the present invention, there is provided a magnetic resonance imager capable of efficiently suppressing artifacts in radial scanning.

BRIEF DESCRIPTION OF THE DRAWINGS

FIG. 6 is a flowchart describing estimation of unmeasured echo to be performed according to the present invention (first embodiment);

FIG. 7 shows the results of estimation of unmeasured echo performed according to the present invention (first embodiment);

BEST MODE FOR CARRYING OUT THE INVENTION

Figure 1A:
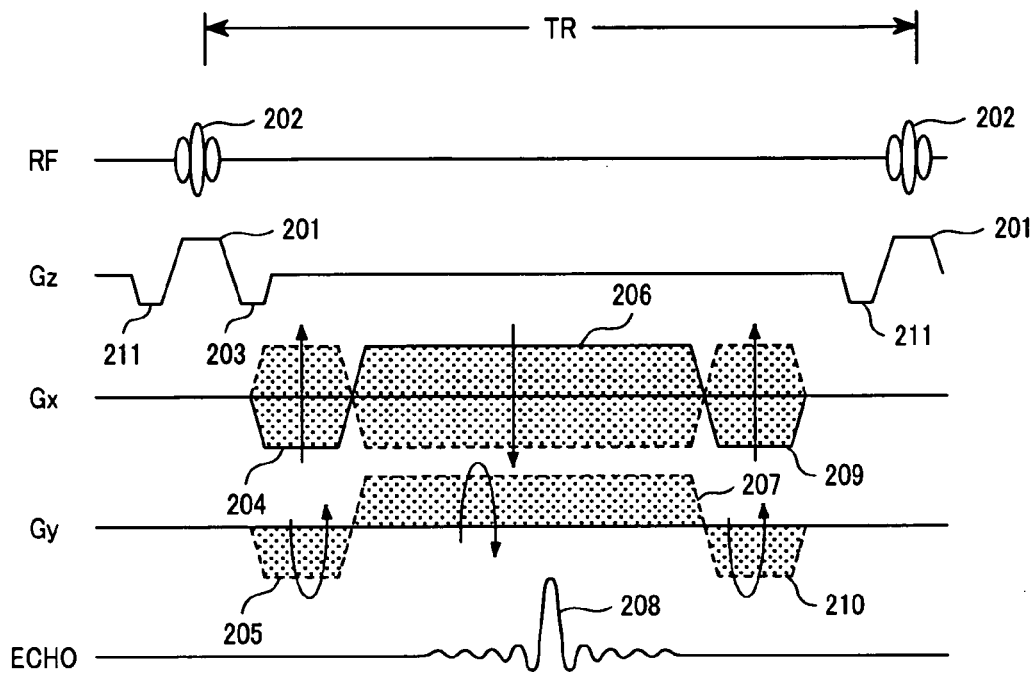
FIG. 1 is an explanatory diagram concerning a pulse sequence for conventional GE radial scanning and a k-space.

Referring to the drawings, embodiments of the present invention will be described below.

First Embodiment

Figure 3:
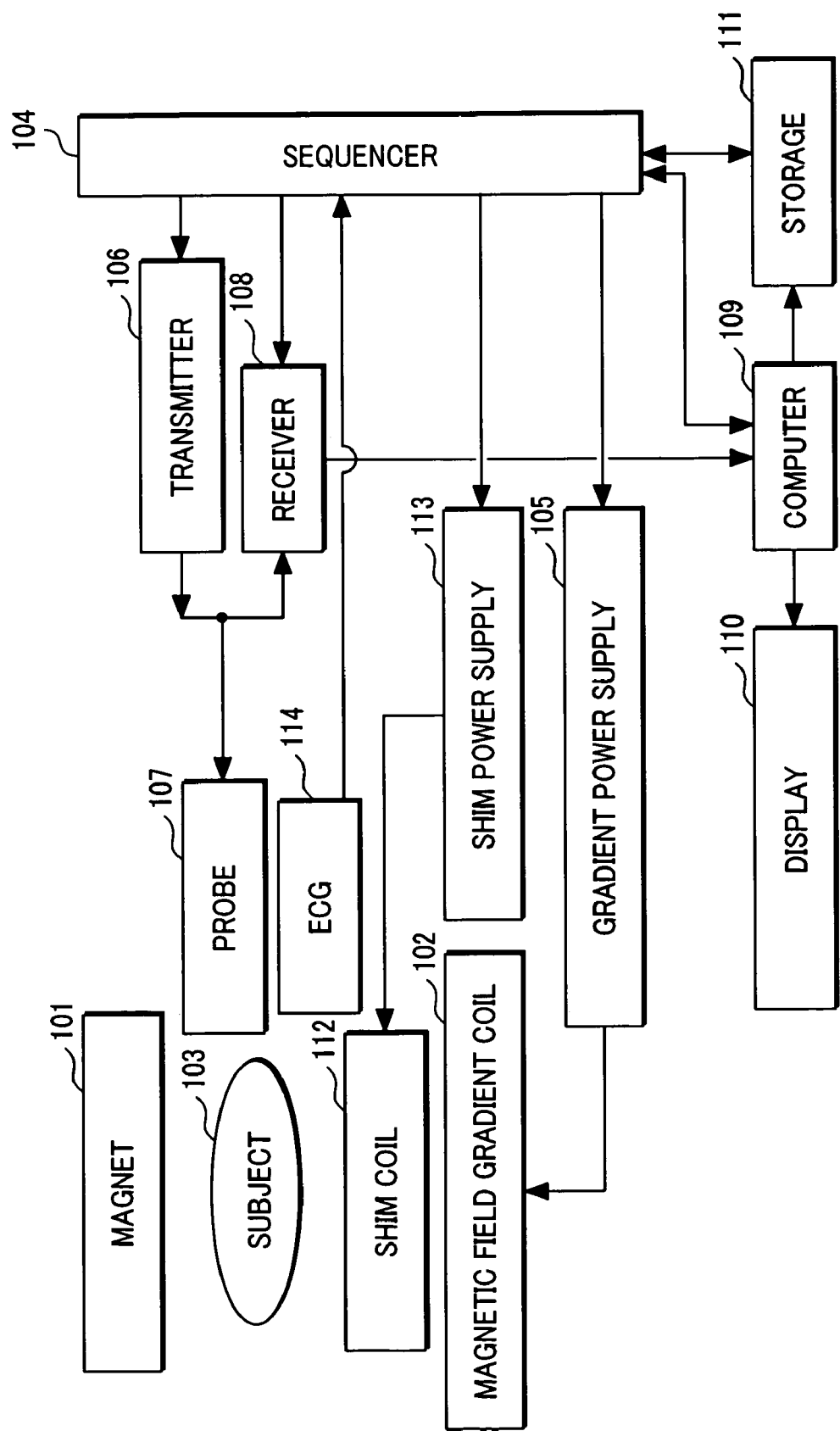
FIG. 3 shows an example of the configuration of a nuclear magnetic resonance imager to which the present invention is adapted.

FIG. 3 is a block diagram showing the outline configuration of a magnetic resonance imager.

In FIG. 3, reference numeral 101 denotes a magnet that generates a static magnetic field, 102 denotes a coil that induces a magnetic field gradient, and 103 denotes a subject (for example, a living body). The subject 103 is carried to a space of a static magnetic field generated by the magnet 101. A sequencer 104 transmits an instruction to each of a gradient power supply 105 and a transmitter 106, and thus allows them to induce a magnetic field gradient and a radio frequency magnetic field respectively. The radiofrequency magnetic field is applied to the subject of examination 103 via a probe 107. A signal induced in the subject of examination 103 is received by the probe 107, and detected by a receiver 108. A nuclear magnetic resonant frequency to be adopted as a reference for detection (hereinafter a detection reference frequency) is set by the sequencer 104. The detected signal is transmitted to a computer 109. The computer 109 performs signal processing such as image reconstruction.

The results of signal processing are displayed on a display 110. If necessary, a detected signal and the conditions for measurement may be stored in a storage 111. Moreover, an electrocardiograph 114 connected to the sequencer 104 is located in the static magnetic field space, and can be used to obtain an electrocardiogram of the subject 103. The electrocardiogram is transferred to the sequencer 104. If the homogeneity in a static magnetic field should be adjusted, a shim coil 112 is employed. The shim coil 112 supports a plurality of channels, and a shim power supply 113 supplies power to the shim coil 112. When the homogeneity in the static magnetic field is adjusted, a current flowing through each shim coil is controlled by the sequencer 104. The sequencer 104 transmits an instruction to the shim power supply 113, and thus allows the coil 112 to induce an additional magnetic field with which the inhomogeneity in the static magnetic field is corrected.

The sequencer 104 extends control so that the other components will operate at respective preprogrammed timings to respective preprogrammed extents. Among programs, a program stating the timing of signal detection and the timings and amplitudes of a radiofrequency magnetic field and magnetic field gradients is referred to as a pulse sequence.

Figure 1B:
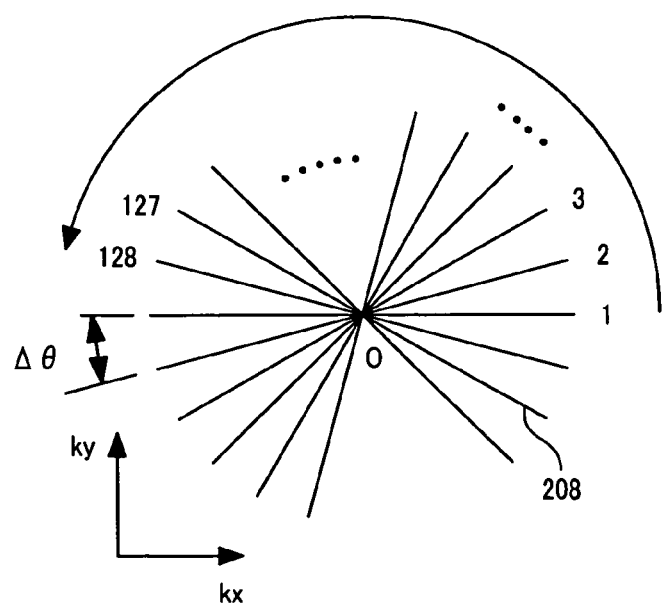
Figure 2:
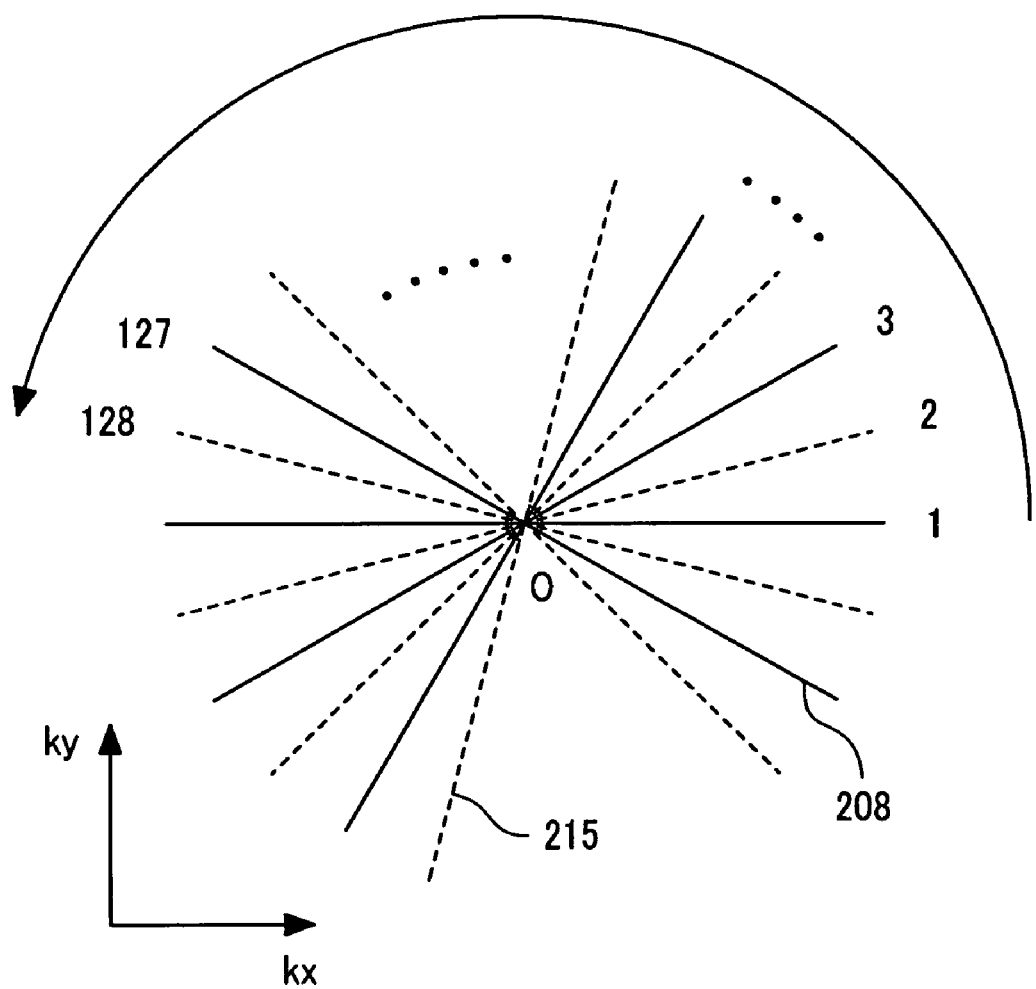
FIG. 2 is an explanatory diagram showing a conventional k-space employed for radial scanning.

In the present embodiment, a GE sequence shown in FIG. 1 is adopted as a pulse sequence. A TR for the pulse sequence is 4 ms, and a number of repetitions comes to 72 by adding eight repetitions for reference to a conventional number of repetitions of 64. Thus, seventy-two echoes are measured. The positions of echoes in the k-space are indicated with solid lines in FIG. 4.

Figure 4:
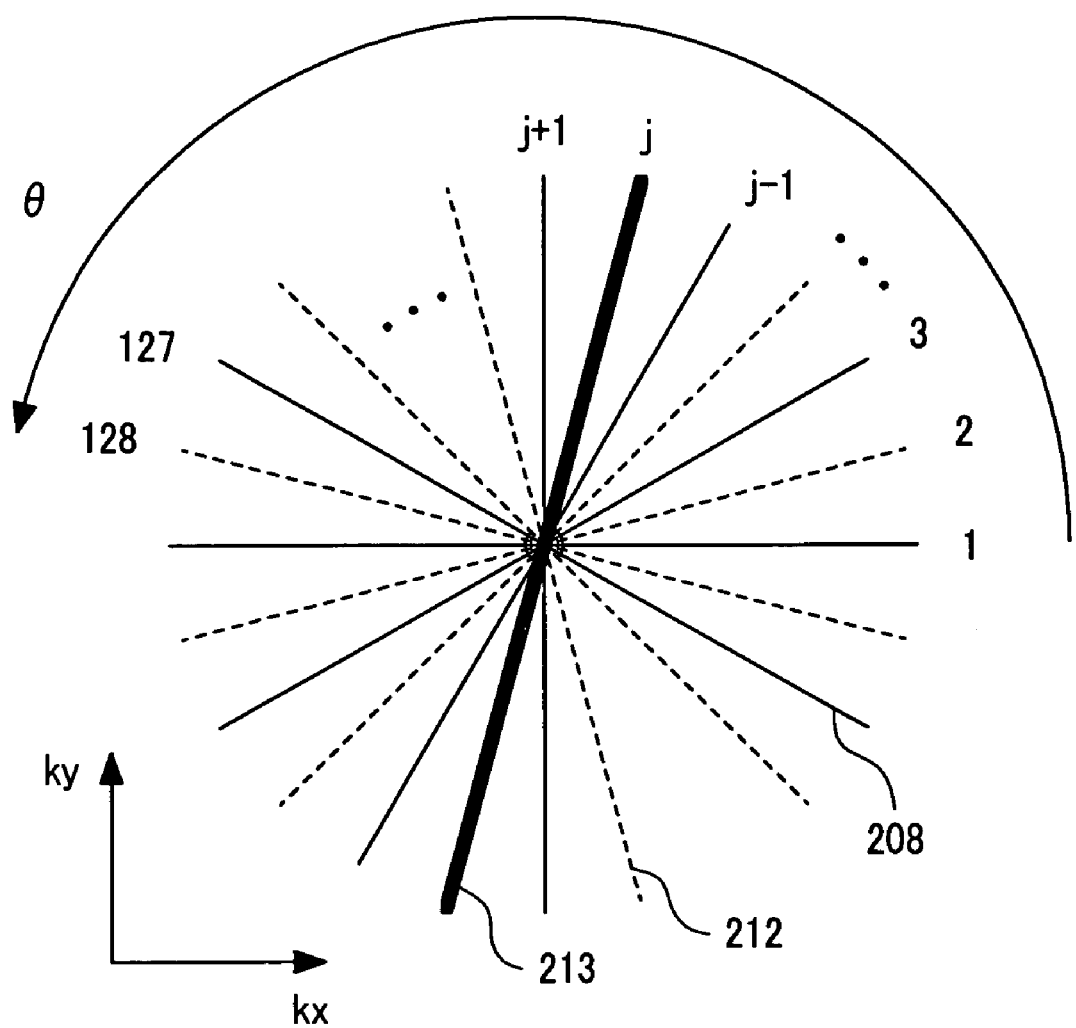
FIG. 4 is an explanatory diagram showing a k-space employed for radial scanning according to the present invention (first embodiment)

In FIG. 4, among echoes indicated with solid lines, an echo 213 indicated with a boldface line is a reference echo. The echo is used to calculate an estimation coefficient, whereby unmeasured echoes 212 indicated with dot lines are estimated. The sum total of echoes including estimated ones comes to one hundred and twenty-eight echoes. The procedure will be described in conjunction with the flowchart of FIG. 6.

Figure 5:
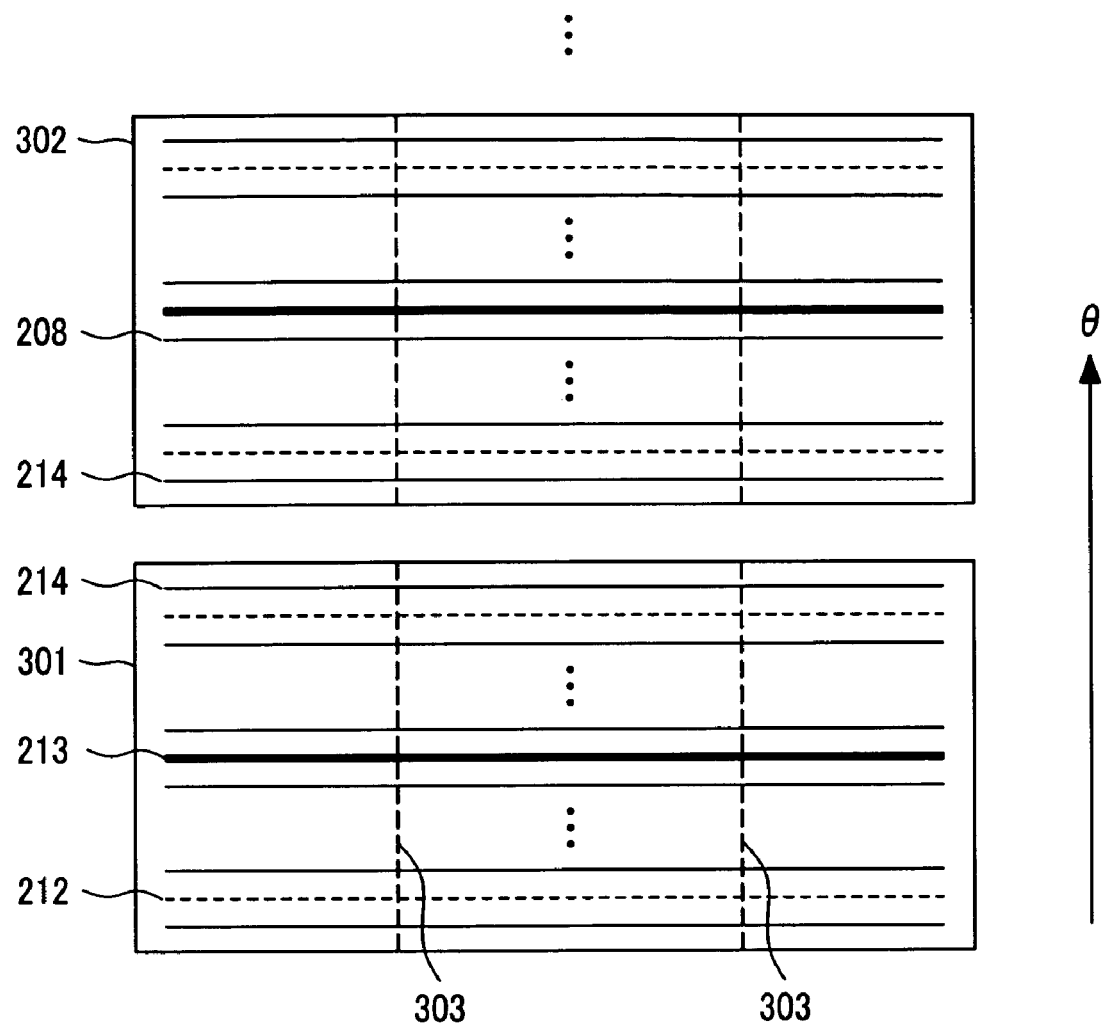
FIG. 5 is an explanatory diagram showing arrangement of echoes employed for estimation of unmeasured echoes according to the present invention (first embodiment)

To begin with, one hundred and twenty-eight echoes including the unmeasured echoes 212 are divided into eight groups one of which includes seventeen echoes (step 401). As shown in FIG. 5, marginal echoes of each group are identical to marginal echoes of two adjoining groups. In FIG. 5, an echo 214 is included as a marginal echo in each of the first group 301 and second group 302. The reference echo 213 is measured to be included in the middle of each group.

Thereafter, an estimation coefficient A=[a1, a2] to be used to estimate the unmeasured echoes 212 included in each group is calculated according to the expression (1) below (step 402).

$$A = RS- \quad (1)$$

where S equals $[S1, S2]^T$ ($a^T$ denotes a transposed matrix), S- denotes a pseudo inverse matrix, and S1 and S2 (column vectors) are echoes adjacent to the reference echo R (row vector).

Thereafter, the estimation coefficient A is used to estimate an unmeasured echo according to the expression (2) below (step 403).

$$Su = AS' \quad (2)$$

where Su denotes an unmeasured echo, and S' equals $[S'1, S'2]^T$ where S'1 and S'2 denote echoes adjacent to Su.

By performing the above processing, each echo is equally divided into Np parts as indicated with dashed lines 303 in FIG. 5. FIG. 5 is concerned with a case where Np equals 3. When an echo is divided, a more highly precise estimate is obtained than the one obtained when one echo is used as it is. An optimal number of parts into which one echo is divided is normally about seven. Assuming that the number of echo sampling points is one hundred and twenty-nine, one echo is divided into parts of, for example, eighteen, eighteen, eighteen, twenty-one, eighteen, eighteen, and eighteen sampling points.

Moreover, the number of reference echoes should be equal to or larger than eight. For example, assuming that the number of reference echoes is four, the k-space is quartered. An angle θ occupied by one quarter is calculated as 360°/4=90°. In this case, echoes contained in the wide range of 90° have to be estimated using one estimation coefficient. An estimate of satisfactory precision cannot therefore be obtained. In contrast, when the number of reference echoes is eight or more, the range covering echoes to be estimated using one estimation coefficient is equal to or smaller than 45°. An estimate of satisfactory precision can therefore be obtained. The larger the number of reference echoes is, the higher the precision in estimation is. However, a measuring time increases accordingly. Therefore, the number of reference echoes is normally set to about eight in terms of efficiency.

Finally, measured echoes and unmeasured echoes that are estimated as mentioned above are combined and gridded. Thereafter, inverse Fourier transform is performed in order to reconstruct an image (step 404).

FIG. 7 shows the results of the foregoing processing actually performed. Sixty-four echoes and eight reference echoes were measured, and fifty-six unmeasured echoes were estimated. The number of echo sampling points is one hundred and twenty-nine. Each echo is divided into seven parts, and estimation is performed.

FIG. 7A shows an image resulting from the processing employed in the present invention. FIG. 7B shows an image resulting from reconstruction performed using sixty-four measured echoes alone. FIG. 7C shows an image resulting from reconstruction performed using one hundred and twenty-eight echoes. In FIG. 7B, numerous streak artifacts are seen in the background because of a small number of echoes. In contrast, in FIG. 7A, streak artifacts are hardly seen, and image quality is greatly improved. Consequently, the image quality is nearly equivalent to the image quality shown in FIG. 7C.

As mentioned above, according to the present embodiment, part of unmeasured echoes is measured as a reference. An estimation coefficient is calculated using echoes adjoining the reference, and the unmeasured echoes are estimated using the estimation coefficient. Consequently, since an echo measured as the reference is one of the unmeasured echoes, an imaging time hardly increases. Moreover, since the reference is used to calculate the estimation coefficient, unmeasured echoes can be highly precisely estimated compared when they are estimated by simple interpolation without using the reference. This results in a magnetic resonance imager capable of suppressing artifacts with little extension of the imaging time.

Second Embodiment

In the pulse sequence shown in FIG. 1(A), a procedure starting with application of a slicing magnetic field gradient to measurement of an echo is repeated, for example, with a repetition time TR set to 4 ms, and the amplitudes of magnetic field gradients are changed so that one image can be produced using sixty-four echoes.

Figure 8A:
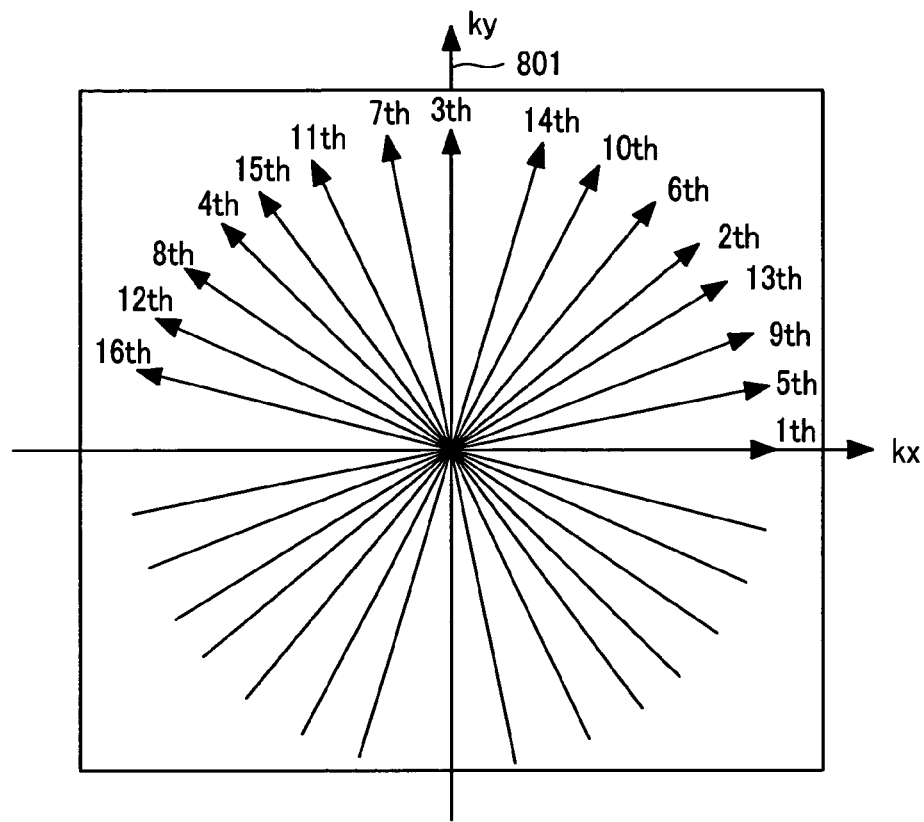
FIG. 8 is an explanatory diagram concerning a sequence of scanning a k-space at intervals of N echoes employed in the present invention (second embodiment)

In the present embodiment, the amplitudes of magnetic field gradients are changed so that the k-space will be scanned in a θ direction at intervals of three echoes. FIG. 8(A) illustratively shows the scanning sequence. At this time, a frame rate is about 4 fps. A sliding window is adopted, and eight echoes are updated at a time. Consequently, the frame rate is increased to 32 fps. Thereafter, gridding is performed in order to re-map echoes to a k-space 802 of a Cartesian grid. Finally, two-dimensional inverse Fourier transform is performed in order to reconstruct an image.

Since the k-space 801 is scanned at intervals of three echoes, the frequencies of streak artifacts shift to higher frequencies. When the frequencies of streak artifacts shift to higher frequencies, the streak artifacts can be suppressed using a temporal filter (low-pass filter).

Furthermore, in order to suppress artifacts occurring on an edge of an image due to under-sampling, data to which the sliding window has not been applied and which is acquired by displacing scanning lines for fear scanning lines for adjoining frames may be superimposed on each other is employed. The temporal filter (low-pass filter) is applied to the time-sequential data, whereby artifacts derived from under-sampling can be suppressed.

Figure 9:
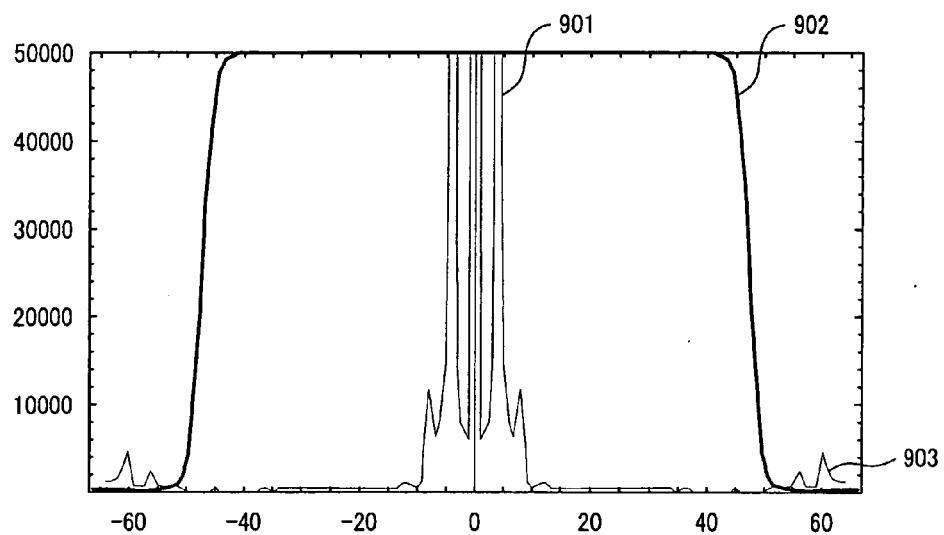
FIG. 9 shows frequency-components of a motion picture reconstructed by scanning the k-space at intervals of three echoes, and a temporal filer (low-pass filter) (second embodiment)

FIG. 9 shows the results 901 of decomposing a motion picture, which is reconstructed by scanning the k-space at intervals of three echoes, into frequencies in a temporal direction as an example of filtering of artifacts, and a temporal filter 902 employed. In FIG. 9, the axis of abscissas indicates frequencies and the axis of ordinates indicates amplitudes. Reference numeral 903 denotes the frequency components of streak artifacts appearing in the motion picture. The temporal filter 902 is applied to the frequency components 901 of the motion picture, whereby the frequency components 903 of streak artifacts can be nullified. Consequently, the streak artifacts can be removed.

FIG. 10 shows the results of imaging performed according to the present invention (first frames of motion pictures). FIG.

Figures 10A, 10B, 10C:
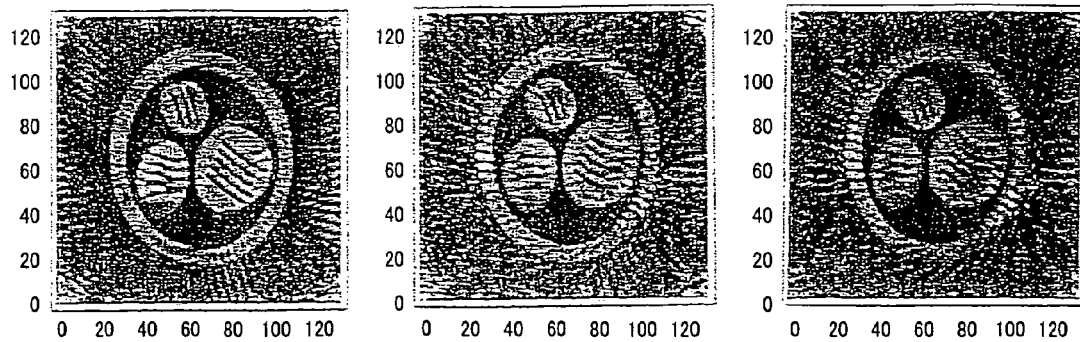
FIG. 10 is an explanatory diagram concerning the results of imaging performed according to the present invention (second embodiment)

10(A) shows an image produced without scanning the k-space at intervals of three echoes, applying the temporal filter (low-pass filter), and suppressing artifacts derived from under-sampling (scanning the k-space at intervals of no echo) FIG. 10(B) shows an image produced by scanning the k-space at intervals of three echoes and applying the temporal filter (low-pass filter). Streak artifacts are seen being suppressed. FIG. 10(C) shows an image produced by scanning the k-space at intervals of three echoes, applying the temporal filter (low-pass filter), and suppressing artifacts derived from under-sampling. Not only streak artifacts attributable to a gap between adjoining data items but also artifacts appearing on an edge of an image are seen being suppressed.

The present embodiment has been described on the assumption that the k-space is scanned at intervals of three echoes. At interval of how many echoes the k-space should be scanned is determined using the expression (3) below.

$$(N+1)=Ne/2 \tag{3}$$

where N denotes the number of echoes N at intervals of which the k-space is scanned, and Ne denotes a magnification by which a frame rate is increased by sharing echoes.

The expression (3) is drawn out as described below. Assuming that a frame rate is multiplied by Ne by sharing echoes, a gap between adjoining data items varies in cycles of Ne/F (where F denotes a frame rate). Accordingly, a streak artifact having a frequency F/Ne occurs. When the k-space is scanned at intervals of N echoes, the number of echoes to be scanned while a scanning line makes one turn is decreased to 1/(N+1). Consequently, the frequency of a change in the gap between adjoining data items is multiplied by (N+1). Accordingly, the frequency of a streak artifact comes to F/Ne×(N+1). The expression (3) is drawn out under the condition of (F/Ne× (N+1)=F/2) that the frequency of a streak artifact should be high (Nyquist rate F/2).

Figure 11:
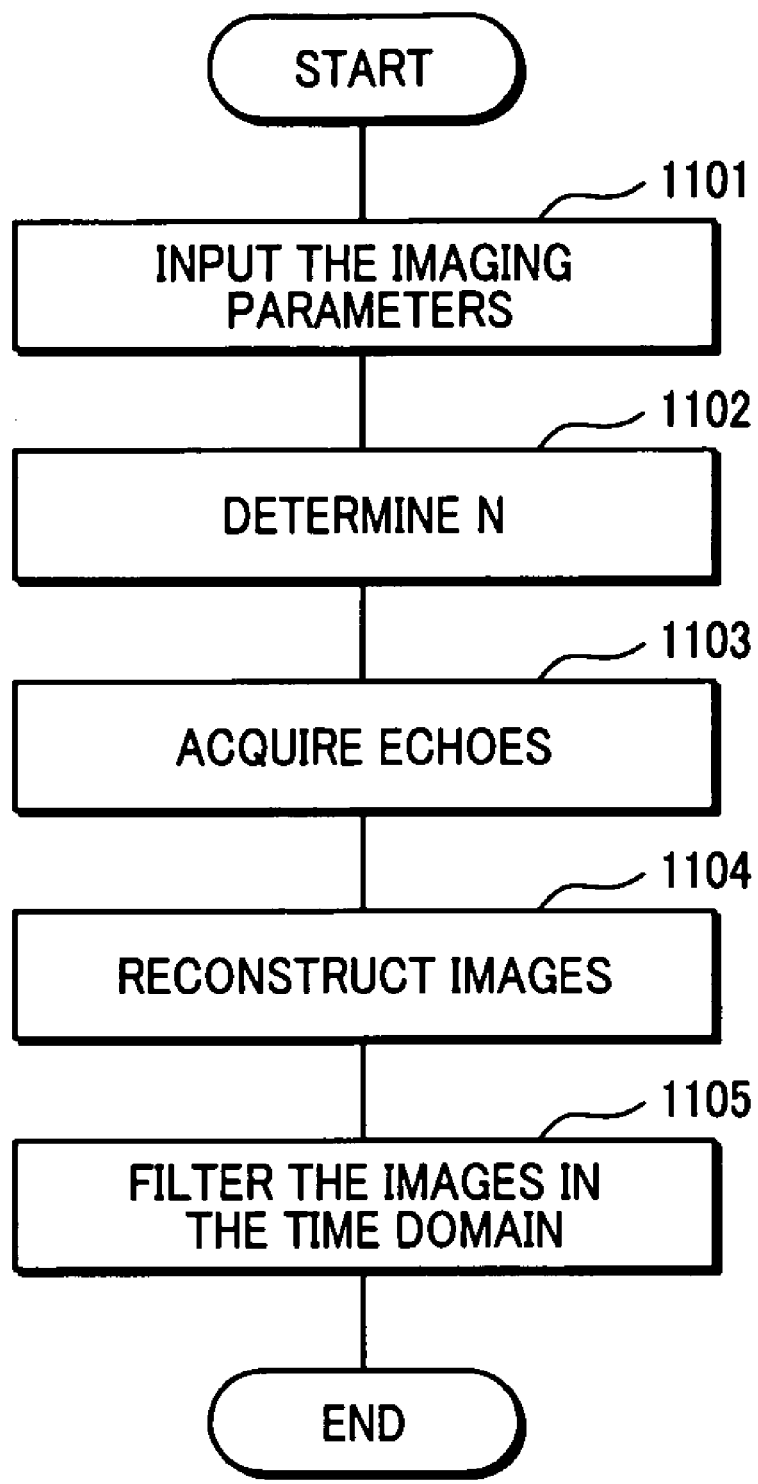
FIG. 11 is an explanatory diagram concerning an imaging procedure employed in the present invention (second embodiment).

FIG. 11 describes an imaging procedure employed in the present invention. To begin with, parameters for an imaging sequence are entered in preparation for imaging (step 1101).

Thereafter, the N value representing the number of echoes N at intervals of which the k-space is scanned is determined according to the expression (3) (step 1102).

Figure 8B:
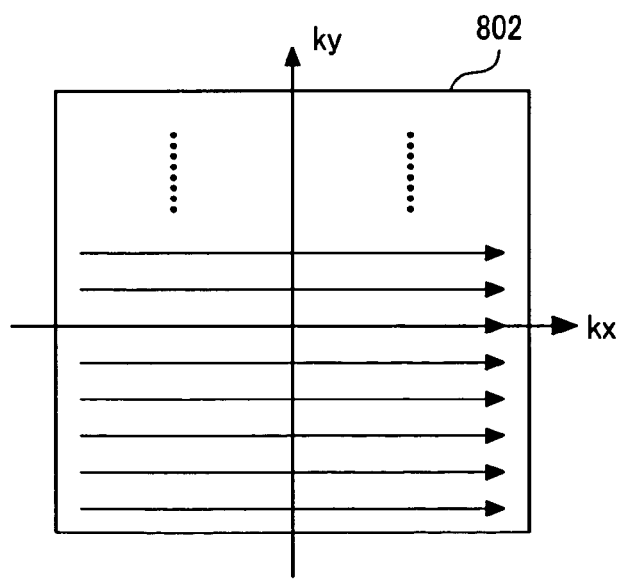

Thereafter, the sequence shown in FIG. 1(A) is applied in order to acquire echoes (step 1103). At this time, as shown in FIG. 8, the k-space is scanned at intervals of N echoes (in the example shown in FIG. 8, N equals 3). Moreover, when artifacts derived from under-sampling are suppressed, the same number of echoes as the required number of frames is alternately scanned for fear scanning lines for adjoining frames may be superimposed on each other.

Thereafter, when the number of echoes required for updating an image has been scanned, image reconstruction is performed (step 1104).

Finally, the temporal filter (low-pass filter) is applied in order to produce an image having streak artifacts suppressed (step 1105). Moreover, when artifacts derived from under-sampling should be suppressed, the temporal filter (low-pass filter) is applied in order to suppress the artifacts.

According to the present embodiment, the frequencies of streak artifacts derived from a gap between adjoining data items acquired by performing radial scanning is manipulated and filtered. Consequently, a marked advantage that the streak artifacts can be suppressed can be expected.

INDUSTRIAL APPLICABILITY

According to the present invention, there is provided a magnetic resonance imager capable of efficiently suppressing artifacts in radial scanning. Moreover, a magnetic resonance imaging technology can be applied to an examination system or the like. This has significant meanings especially in the field of medicine.

The invention claimed is:

1. A magnetic resonance imager comprising:
    a control unit that controls a pulse sequence according to which a radiofrequency magnetic field and magnetic field gradients are applied to a living body lying down in a static magnetic field in order to detect a magnetic resonance signal induced in the living body; and
    a processing unit that handles the signal, wherein:
    the control unit (1) controls the pulse sequence to be applied for performing radial scanning, (2) acquires image echoes by applying the pulse sequence a plurality of times, and (3) acquires reference echoes, each of which lies among image echoes in a k-space, by applying the pulse sequence a plurality of times; and
    the processing unit (1) divides the image echoes and reference echoes into a plurality of groups, (2) uses the reference echo and image echoes preceding and succeeding the reference echo to calculate an estimation coefficient, and (3) uses the estimation coefficient to estimate unmeasured echoes lying among the image echoes in the k-space.

2. The magnetic resonance imager according to claim 1, wherein the reference echo is measured so that one reference echo will be included in the middle of each of the plurality of groups.

3. The magnetic resonance imager according to claim 1, wherein the processing unit divides each of the image echoes and reference echoes into a plurality of parts.

4. The magnetic resonance imager according to claim 3, wherein the number of parts into which each echo is divided is about seven.

5. The magnetic resonance imager according to claim 1, wherein the number of reference echoes is about eight.

6. An examination system utilizing nuclear magnetic resonance and comprising a control unit that controls a pulse sequence, according to which a radiofrequency magnetic field and magnetic field gradients are applied to a subject lying down in a static magnetic field in order to detect a nuclear magnetic resonance signal induced in the subject, wherein:
    the control unit (1) detects the nuclear magnetic resonance signal by radially scanning a k-space, (2) produces a plurality of images, (3) employs a sliding window to obtain the plurality of images, and (4) performs the scanning of the k-space at intervals of n echoes and suppresses artifacts by a low-pass filter after image reconstruction.

7. The examination system according to claim 6, wherein when (3) employing the sliding window, the control unit determines an n value representing the number of echoes, n, at intervals of which the k-space is scanned so that the frequencies of artifacts will be controlled to get close to a Nyquist rate.

8. The examination system according to claim 6, wherein when (1) detecting the nuclear magnetic resonance signal and (2) producing a plurality of images, the control unit thins scanning lines, changes the way of thinning scanning lines among images, and thus scans the k-space so that artifacts will be cyclically varied.

* * * * *